(12) United States Patent
Arkles et al.

(10) Patent No.: US 6,770,726 B1
(45) Date of Patent: Aug. 3, 2004

(54) β-SUBSTITUTED ORGANOSILSESQUIOXANE POLYMERS

(75) Inventors: Barry C. Arkles, Dresher, PA (US); Donald H. Berry, Dresher, PA (US)

(73) Assignees: Gelest, Inc., Morrisville, PA (US); University of Pennsylvania, Philadelphia, PA (US)

( * ) Notice: Subject to any disclaimer, the term of this patent is extended or adjusted under 35 U.S.C. 154(b) by 0 days.

(21) Appl. No.: 09/221,554

(22) Filed: Dec. 28, 1998

Related U.S. Application Data

(60) Continuation-in-part of application No. 08/922,613, filed on Sep. 3, 1997, now Pat. No. 5,853,808, which is a division of application No. 08/527,051, filed on Sep. 12, 1995, now abandoned.

(51) Int. Cl.$^7$ ............................................... C08G 77/24
(52) U.S. Cl. ............................. 528/42; 528/10; 528/39; 528/32
(58) Field of Search .............................. 528/42, 10, 32, 528/39

(56) References Cited

U.S. PATENT DOCUMENTS

| | | | |
|---|---|---|---|
| 3,615,272 A | 10/1971 | Collins et al. ................ | 23/366 |
| 3,666,830 A | * 5/1972 | Alekna ........................ | 260/825 |
| 4,743,474 A | 5/1988 | Homan ........................ | 427/387 |
| 4,923,775 A | * 5/1990 | Schank ........................ | 430/59 |
| 4,999,397 A | 3/1991 | Weiss et al. ................. | 524/755 |
| 5,010,159 A | 4/1991 | Bank et al. .................. | 528/423 |
| 5,047,492 A | 9/1991 | Weidner et al. ............... | 528/15 |
| 5,290,354 A | 3/1994 | Haluska ....................... | 106/479 |
| 5,320,868 A | 6/1994 | Ballance et al. ............. | 427/228 |
| 5,371,262 A | 12/1994 | Arkles ........................ | 556/449 |

OTHER PUBLICATIONS

Sommer et al., "Organosilicon Compounds V. beta Eliminations Involving Silicon", J. Amer. Chem. Soc. 68; pp. 1083–1085, 1946.*

L. H. Sommer et al., "Organosilicon Compounds. V. β–Eliminations Involving Silicon," J. Amer. Chem. Soc., 68, pp. 1083–1085 (1946).

L. H. Sommer et al., "Organo–silicon Compounds. III. α–and β–Chloroalkyl Silanes and the Unusual Reactivity of the Latter." J. Amer. Chem. Soc., 68, pp. 485–487 (1946).

L.H. Sommer et al., "Further Studies of β–Eliminations Involving Silicon," J. Amer. Chem. Soc., 70, pp. 2869–2872 (1948).

* cited by examiner

*Primary Examiner*—Margaret G. Moore
(74) *Attorney, Agent, or Firm*—Akin Gump Strauss Hauer & Feld, LLP

(57) ABSTRACT

Silsesquioxane polymers that are useful for preparing $SiO_2$-rich ceramic coatings are obtained as the polymeric reaction products from the hydrolysis and condensation of organosilanes having a β-substituted alkyl group. A preferred silsesquioxane polymer is the polymeric reaction product obtained from β-chloroethyltrichlorosilane. More preferred silsesquioxanes are those with non-halogenated alkyl groups, such as the β-acetoxyethyl- and β-hydroxyethyl-silsesquioxones. Coating compositions containing such silsesquioxane polymers dissolved in organic solvent may be applied to a substrate and converted to $SiO_2$-rich ceramic thin layers by evaporating the solvent and heating the coated substrate at moderate temperatures.

19 Claims, No Drawings

β-SUBSTITUTED ORGANOSILSESQUIOXANE POLYMERS

CROSS-REFERENCE TO RELATED APPLICATIONS

This is a continuation-in-part of application Ser. No. 08/922,613, filed Sep. 3, 1997, now U.S. Pat. No. 5,853,808, which in turn was a division of application Ser. No. 08/527,051, filed Sep. 12, 1995, now abandoned, the disclosure of which is incorporated herein by reference.

BACKGROUND OF THE INVENTION

This invention relates to siloxane, silsesquioxane and modified silsesquioxane polymers.

Silicon dioxide ($SiO_2$) thin films are an essential component of microelectronic devices and substrates that are currently in widespread usage. These $SiO_2$-containing thin films are generally created using well-known silanes, e.g., $H_4Si$, silane esters, e.g., tetraethoxysilane (TEOS), or silsesquioxanes, e.g., hydrogen silsesquioxane resins such as described in U.S. Pat. No. 5,290,354 of Haluska and U.S. Pat. No. 5,320,863 of Ballance et al.

Component (e.g., transistor) densities on microelectronic devices have continually increased in recent years, and the current development of ultra large scale integration (ULSI) technology, to implement in excess of 300,000 transistors per chip, places severe constraints on layered $SiO_2$-containing thin films and coating application processes employed. The ULSI requirements for multilevel and submicron interconnections demand defect-free uniform silicon dioxide thin films that are not easily achieved with current coating application methodologies, such as spin-on glass (SOG) and chemical vapor deposition (CVD), using known $SiO_2$-forming resins.

SOG ceramic thin films made from known $SiO_2$-film forming materials typically exhibit voids if gap dimensions are less than 0.15 micron. Water evolution during curing of such SOG coating compositions results in high shrinkage and stressed films. SOG coating compositions using methyltriethoxysilane, instead of the more commonly used tetraethoxysilane (TEOS), require a greater degree of cure before plastic flow characteristics of the resin are overcome, which may adversely affect planarization characteristics.

CVD ceramic thin films made using TEOS can provide submicron interconnections but do not provide satisfactory high gap-fill capacity and reliability, a requirement of ULSI multilevel interconnections. The tendency of TEOS/CVD ceramic thin films to absorb water can lead to decreased reliability from degradation of metal interconnections. CVD ceramic thin films that incorporate boron or phosphorus exhibit improved process parameters but at the cost of sacrificed dielectric properties. CVD thin films derived from known silsesquioxanes, instead of TEOS or other silanes, exhibit reduced dimensional stability, particularly upon thermal cycling required for interlayer application.

Sommer et al., "Organosilicon Compounds V. β-Eliminations Involving Silicon," *J. Amer. Chem. Soc.*, 68, pp. 1083–1085 (1946) summarizes chemical reaction studies of β-chloroethyltrichlorosilane and β-chloro-n-propyltrichlorosilane, including synthesis of β-chloroethyl silicone. The β-chloroethyl silicone polymer, having a formula $ClCH_2CH_2SiO_{1.5}$, was reacted with dilute alkali to give ethylene and $Si(OH)_4$. No end use applications for these compounds were suggested.

SUMMARY OF THE INVENTION

In accordance with the present invention, a silsesquioxane polymer, useful for preparing $SiO_2$-rich films, is the polymeric reaction product that is obtained from the hydrolysis and condensation polymerization of an organosilane containing a β-substituted alkyl group, the organosilane having the general formula $R_nSiX_{(4-n)}$ where n is 1 or 2; X is a halogen selected from the group consisting of chlorine, bromine, fluorine, and iodine, or an alkoxy selected from the group consisting of methoxy, ethoxy and propoxy substituents; and R is an alkyl group having at least one but not more than two β-substituents that are electronegative, and wherein the polymeric reaction product contains silanol groups. The β-substituted alkyl group, R in the general formula, is preferably an ethyl group or propyl group having at least one but not more than two β-substituents selected from the group consisting of chlorine, bromine, fluorine, iodine, hydroxy, methoxy, ethoxy, and acetoxy The β-substituted organosilsesquioxane polymer of this invention may also contain at least one but not more than two α-substituents on the β-substituted alkyl group, the α-substituent on the β-substituted alkyl group being selected from the group consisting of chlorine, bromine, fluorine, iodine, hydroxy, methoxy, ethoxy and acetoxy. The α-substituent on such a silsesquioxane polymer is preferably the same as the β-substituent on the alkyl group.

A preferred embodiment of this invention is a silsesquioxane polymer, useful for preparing $SiO_2$-rich films, that is the polymeric reaction product obtained from the hydrolysis and condensation polymerization of an organosilane containing a β-substituted ethyl group, the organosilane having the general formula $R_nSiX_{(4-n)}$ where n is 1 (i.e., the general formula becomes $RSiX_3$); X is a halogen selected from the group consisting of chlorine and bromine or an alkoxy selected from the group consisting of methoxy and ethoxy substituents; and R is a β-substituted ethyl group where the β-substituent is mono- or di-substituted and is selected from the group consisting of chlorine, bromine, fluorine, hydroxy, methoxy, and acetoxy, the non-halogen β-substituents being particuarly preferred.

This silsesquioxane polymer may also contain at least one but not more than two α-substituents on the β-substituted ethyl group, the α-substituent being selected from the group consisting of chlorine, bromine, fluorine, hydroxy, methoxy and acetoxy. The α-substituent on such a silsesquioxane polymer is preferably the same as the β-substituent on the ethyl group.

A preferred β-substituted organosilsesquioxane polymer of this invention, useful for preparing $SiO_2$-rich films, is the polymeric reaction product that is obtained from the hydrolysis and condensation polymerization of an organosilane containing a β-substituted ethyl group, the organosilane being β-chloroethyltrichlorosilane, $ClCH_2CH_2SiCl_3$. More preferred are the non-halogen substitutents at the β position.

The β-substituted organosilsesquioxane polymeric reaction products of this invention contain free silanol groups. Such silsesquioxane polymer compositions are preferably polymeric reaction products that contain at least about five up to about 75 silanol groups per 100 silicon atoms and more preferably that contain about 20 to about 50 silanol groups per 100 silicon atoms.

The silsesquioxane polymer of this invention is preferably a polymeric reaction product that is obtained from homopolymerization of the organosilane. In alternative embodiments, the β-substituted organosilsesquioxane polymer may be a polymeric reaction product that is obtained from copolymerization of the organosilane with an alkoxysilane, e.g., a tetraalkoxysilane or organic substituted alkoxysilane. The alkoxysilane is preferably selected from the group consisting of tetraalkoxysilanes such as tetraethoxysilane (TEOS), tetramethoxysilane (TMOS), methoxytriethoxysilane, triethoxychlorosilane, and organic substituted alkoxysilanes such as bis(β-chloroethyl) dichlorosilane, bis(trimethoxysilyl)ethane, methyltriethoxysilane, vinyltriethoxysilane, pentafluorophenyltriethoxysilane, tridecafluorooctyl-1H, 2H,2H-octyltriethoxysilane and phenyltrimethoxysilane.

The silsesquioxane polymer may also be a polymeric reaction product that is obtained from copolymerization of the organosilane with a hydride functional silane, preferably trichlorosilane, $HSiCl_3$, or triethoxysilane.

$SiO_2$-rich ceramic thin films may be formed on a substrate by applying a coating composition containing the silsesquioxane polymer of this invention onto a substrate, as described in our U.S. Pat. No. 5,853,808. The coating composition containing the silsesquioxane polymer is preferably a homogeneous liquid that includes an organic solvent for dissolving the silsesquioxane polymer, the solvent being selected from the group consisting of aromatic hydrocarbons and their epoxy-functional derivatives, glycol ethers, alkanes and their epoxy-functional derivatives, ketones, esters and orthoesters, chlorinated hydrocarbons, chlorinated hydrocarbons, chlorofluorocarbons and alcohols.

DETAILED DESCRIPTION OF THE INVENTION

The siloxane polymers of this invention are useful for applying thin films or layers of silicon dioxide to substrates, particularly $SiO_2$-containing ceramic thin films that are applied to electronic substrates. These siloxane polymers are silsesquioxane polymers containing β-substituted organic groups which serve as electron-withdrawing substituents, a characteristic that facilitates their subsequent conversion into $SiO_2$-rich uniform, crack-free thin films.

The silsesquioxane polymers are obtainable from the hydrolysis and condensation polymerization of specific silane monomers, containing β-substituted organic groups, in particular, β-substituted alkyl groups. The β-substituted alkyl groups are also present in the silsesquioxane polymers of this invention.

The β-substituents on the alkyl groups in this invention are those containing a substituent that is electronegative, in the β or 2 carbon position of the alkyl group, relative to the organic group's attachment to silicon. A preferred β-substituted alkyl group employed in this invention is chlorine on an ethyl group, namely, the preferred β-chloroethyl group, but other β-substituents that are strongly electron-withdrawing are also suitable. The non-halogenated β-substitutents, such as hydroxy, methoxy, ethoxy and acetoxy, are particularly preferred because they do not form objectionable hydrochloric acid (HCl) byproduct during the hydrolysis and condensation polymerization reaction.

The β-substituted alkyl groups utilized in this invention are labile but are also hydrolytically stable, which permits preparation of the β-substituted organosilsesquioxane polymers under typically aqueous conditions, e.g., in aqueous media. The β-substituted alkyl groups appear to limit $SiO_2$ matrix formation during preparation of the β-substituted organosilsesquioxane polymeric reaction product. The recovered β-substituted organosilsesquioxane polymer may subsequently be converted, by heating of the polymer, to a $SiO_2$-rich ceramic material, preferably as a thin film ceramic coating on a substrate.

Upon such subsequent heating of the β-substituted organosilsesquioxane polymers at relatively moderate temperature conditions, the labile β-substituted alkyl groups appear to be volatilized and substantially eliminated from the $SiO_2$-rich ceramic material that forms during this process. These aspects of the present invention are discussed in more detail further below.

The β-substituted organosilsesquioxane polymers of this invention may be obtained from the hydrolysis and condensation polymerization reaction of any of a variety of organosilanes containing at least one β-substituted alkyl group, where the β-substituent is electronegative and strongly electron-withdrawing.

These organosilanes may be characterized as having the general formula $R_nSiX_{(4-n)}$ where n is 1 or 2, with n preferably being 1. In the general formula, X represents a halogen selected from chlorine, bromine, fluorine, iodine, or an alkoxy group selected from methoxy (—$OCH_3$), ethoxy (—$OCH_2CH_3$), and propoxy (—$OCH_2CH_2CH_3$, —$OCH(CH_3)_2$) substituents. Preferably, X in the general formula is chlorine, bromine, methoxy or ethoxy. In the general formula, R represents the β-substituted alkyl group that is a β-substituted ethyl or propyl group or other equivalent β-substituted alkyl group, where the β-substituent is selected from chlorine, bromine, fluorine, iodine, hydroxy (—OH), methoxy (—$OCH_3$), ethoxy (—$OCH_2CH_3$), and acetoxy (—$OCOCH_3$). The β-substituted alkyl group is preferably a β-substituted ethyl group.

The β-substituent may be present on the alkyl group as a single β-substituent or as two β-substituents. In the latter case, the β-substituents may be the same or different, although preferably the substituents are the same.

The β-substituent is located on the β-carbon of the alkyl group, sometimes referred to as the 2-carbon position, located with respect to the silicon bond. The β-substituted alkyl group is bound to the silicon at the α- or 1-carbon position.

The β-substituted organosilanes defined by the general formula noted above may also contain substituents bound to the ethyl or propyl or other equivalent alkyl group at the α-carbon position. The α-substituents are selected from the same group as that for the β-substituents, as described above. The α-substituents may be present on the β-substituted alkyl group as a single α-substituent or as two α-substituents, and in the latter case the substituents are preferably the same. The α- and β-substituents may be the same or different, although preferably all substituents are identical.

For organosilanes containing β-substituted propyl groups, the γ-carbon (or 3-carbon) position may also contain one or two γ-substituents selected from the same group as that noted above for the β-substituents. The γ-substituents may be the same or different if two γ-substituents are present, and the γ-substituent(s) may also be the same as or different from the other substituents on the propyl group.

Among the preferred organosilanes are those containing a single β-substituted ethyl group containing chlorine, bromine, fluorine or alkoxy substituents. Preferred organosilanes are β-substituted ethyltrichlorosilanes, β-substituted ethyltriethoxysilanes and β-substituted ethyl trimethoxysilanes.

As noted above, the β-substituted alkyl groups, such as the preferred β-substituted ethyl groups in the organosilane monomers used to prepare the β-substituted organosilsesquioxane polymers of this invention, limit the degree of crosslinking in the silicon oxygen network during hydrolysis. This characteristic of the β-substituted organosilsesquioxane polymers facilitates their subsequent use in the preparation of SiO$_2$-rich ceramic thin films, particularly on electronic substrates.

When the β-substituted organosilsesquioxane polymers are reacted further, either by heating at moderate temperatures, e.g., above about 150° C., or by exposure to ultraviolet radiation, the labile β-substituted alkyl groups are substantially volatilized and the silsesquioxane polymer is converted to a SiO$_2$-rich ceramic material, suitable for preparing thin films or layers on electronic substrates.

The silsesquioxane polymers of this invention, obtainable from the hydrolysis and condensation polymerization reaction of β-substituted organosilanes, contain free silanol groups (Si—OH), i.e., unreacted or non-condensed silanol groups. Preferred silsesquioxane polymers contain at least about five silanol groups per 100 silicon atoms, up to about 75 silanol groups per 100 silicon atoms, in the polymeric reaction product. More preferably, the silsesquioxane polymers contain about 20 to about 50 silanol groups per 100 silicon atoms in the polymeric reaction product.

The free silanol content in the polymeric reaction product is initially high, and this can be maintained by neutralizing the reaction mixture and recovering the polymeric reaction product. In the presence of a catalyst, typically an acid, condensation of the free silanol groups proceeds with the generation of water as a byproduct. Polymeric reaction products with low levels of free silanol groups can be prepared, for example, by refluxing the polymer reaction product in an organic solvent, e.g., benzene, in the presence of an acid catalyst and collecting byproduct water, e.g., in a Dean-Stark trap. Such polymerized reaction products, with lower levels of free silanol, exhibit more extensive crosslinking that results from the reaction of the free silanol groups originally present.

The β-substituted organosilsesquioxane polymers of this invention are preferably the homopolymerization reaction products of the organosilanes described above.

The present invention, however, also extends to copolymerizations of the β-substituted organosilanes with other silanes such as tetraalkoxysilanes, organic substituted alkoxysilanes or halosilanes. Copolymerization of the selected β-substituted organosilane with alkoxysilanes such as tetraethoxysilane (TEOS), tetramethoxysilane (TMOS), methoxytriethoxysilane, triethoxychlorosilane, bis(β-chloroethyl)dichlorosilane, bis(trimethoxysilyl)ethane and the like serves to reduce or lower the organic content of the resultant copolymeric reaction product.

On the other hand, copolymerization of the β-substituted organosilane with organoalkoxysilanes such as methyltriethoxysilane, vinyltriethoxysilane, pentafluorophenyltriethoxysilane, tridecafluorooctyl-1H, 2H,2H-octyltriethoxysilane, phenyltrimethoxysilane and the like serves to increase the organic content of the resultant copolymeric reaction product.

The silsesquioxane polymers of this invention also include copolymerization reaction products with a hydride- or organo-functional silane such as trichlorosilane or ethyltrichlorosilane. Preferred trichlorosilanes include trichlorosilane (HSiCl$_3$) triethoxysilane (HSi(OC$_2$H$_5$)$_3$), and organotrichlorosilane like ethyltrichlorosilane, methyltrichlorosilane and phenyltrichlorosilane.

The silsesquioxane polymers are obtained by the hydrolysis and condensation of the β-substituted organosilane, either in the homopolymerization of the organosilane monomer or its copolymerization as described above. The hydrolysis and condensation polymerization reactions are exothermic and may be controlled via factors that are typically important in such hydrolysis and condensation reactions, and some of these are described below.

The hydrolysis and condensation polymerization may be carried out in conventional equipment, by the addition of the organosilane monomer (or both monomers in the case of copolymerization) to an aqueous medium. The aqueous medium may be simply water or may be an aqueous alcohol. The monomer may be added neat or may be first solubilized in a solvent, e.g., methylene chloride. The monomer is preferably added at a measured rate, e.g., slowly, to the aqueous medium to obtain more precise control of the hydrolysis and condensation.

Additional control of the hydrolysis and condensation polymerization reactions may also be obtained though adjustment of the temperature of the aqueous reaction medium, by maintaining the reaction temperature in the range of about 0° C. to about 50° C. Preferably, the temperature of the aqueous reaction medium is maintained at a temperature around (but above) the freezing point of the aqueous medium, about 0° C. to about 5° C. being preferred.

At the preferred reaction temperatures, the hydrolysis and condensation reactions occur more slowly. This permits, for example, the level of silanol content in the polymeric reaction product to be adjusted with greater control and precision.

Recovery of the polymeric reaction product, i.e., the β-substituted organosilsesquioxane polymers, from the aqueous reaction medium may be carried out using conventional techniques, e.g., solvent extraction (with organic solvents that solubilize the polymeric reaction product but are immiscible with the aqueous reaction medium), salting-out of the polymeric reaction product, and the like. The polymeric reaction product may then be recovered as a substantially pure material (i.e., polymer) in solid form, by filtration or evaporation of the extract solvent as applicable. Alternatively, the selection of extraction solvent could be made such that the solvent is also appropriate as a coating solvent, for applying the polymeric reaction product in a solvent-based coating composition to form a SiO$_2$-rich ceramic thin film on a substrate.

The β-substituted organosilsesquioxane polymers of this invention are particularly useful for applying SiO$_2$-rich ceramic thin films to various substrates as described further in our U.S. Pat. No. 5,853,808. These ceramic thin films are particularly valuable on electronic substrates, e.g., electronic devices or circuits.

The silsesquioxane polymers of this invention may be coated onto the desired substrate by any practical means, but a preferred approach uses a solution comprising the silsesquioxane polymer in a suitable solvent.

For the preferred solution coating method, the solution is generally formed by simply dissolving or suspending the silsesquioxane polymer in a solvent or mixture of solvents. The solvents which may be used in this method are preferably moderately polar solvents, which may include organic solvents selected from the group consisting of aromatic hydrocarbons and their epoxy-functional derivatives, glycol ethers, alkanes and their epoxy-functional derivatives, ketones, esters such as monomethylether acetate, orthoesters, chlorinated hydrocarbons, chlorofluorocarbons and alcohols. Exemplary organic solvents include diglyme (diethylene glycol dimethyl ether), dimethoxyethane, methoxyethylacetate, toluene, and alcohols such as ethanol, methoxypropanol, propoxypropanol and propylene glycol.

Halogen-gettering solvents are especially useful as coating solvents and these include orthoesters such as trimethylacetate and epoxy-functional solvents such as epoxybutane. Halogen-gettering solvents are believed to be useful in the coating compositions and method of this invention for their ability to react with byproduct hydrogen chloride or to react with intermediate Si—Cl-containing species and thus moderate the speed of reaction and eliminate corrosive byproducts.

The coating composition, a homogeneous liquid containing the silsesquioxane polymer in an organic solvent, is then applied to the substrate. Coating means such as spin, spray, dip or flow coating may be utilized. For application to electronic substrates, the coating composition may be applied by the conventional spin-on glass (SOG) techniques, for example.

Following application of the coating composition to the substrate, the coating solvent is allowed to evaporate by means such as simple air drying, by exposure to an ambient environment or by the application of a vacuum or mild heat.

The present invention is illustrated further by the following non-limiting Examples.

EXAMPLE 1

Preparation of 2-Chloroethylsilsesquioxane

β-chloroethyltrichlorosilane ($ClCH_2CH_2SiCl_3$) in an amount of 25.0 g (0.126 mol) was added dropwise with stirring to 250 mL distilled water at a temperature of 0° C. Upon completion of the addition of the β-chloroethyltrichlorosilane, an organic solvent, dichloromethane in an amount of 200 mL, was added to the aqueous reaction medium and stirred for ten minutes, in order to extract the polymeric reaction product from the aqueous medium. The reaction mixture was then filtered to remove a small amount of precipitate that formed, and the organic phase containing dichloromethane and extracted reaction product was next separated from the aqueous phase and retained. The aqueous phase was then extracted further with three washings of dichloromethane, in an amount of 100 mL each. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 10.65 g (a recovery of 73% of total theoretical yield) of 2-chloroethylsilsesquioxane polymer. A small amount of unidentified precipitate, 0.3 g in amount, was also isolated from the reaction mixture as noted above. The polymeric reaction product was determined to have a number average molecular weight (Mn) of 750–1250 and a weight average molecular weight (Mw) of 1200–1600, both determined by GPC relative to a polystyrene standard calibration. An NMR analysis indicated an approximate ratio of 1 hydroxyl group for every three silicon atoms.

EXAMPLE 2

Preparation of 2-Bromoethylsilsesquioxane

β-bromoethyltrichlorosilane ($BrCH_2CH_2SiCl_3$) in an amount of 18.24 g (0.075 mol) was added dropwise with stirring to 250 mL of distilled water at a temperature of 0° C. Dichloromethane in an amount of 200 mL was then added to the aqueous reaction medium to extract the polymeric reaction product from the aqueous medium, and the reaction mixture was stirred for ten minutes. The reaction mixture was then filtered to remove a small amount of precipitate that formed, and the organic phase containing dichloromethane and extracted reaction product was next separated from the aqueous phase and retained. The aqueous phase was extracted further with additional washings of dichloromethane, three volumes of 100 mL each. The dichloromethane washings were combined with the original organic phase extract, and the combined organic phase solution was dried by stirring over sodium sulfate for one hour and then filtered. After evaporation of the solvent from the organic phase extract, the polymeric reaction product that was recovered was dried overnight under high vacuum to yield a clear resin, in an amount of 7.03 g (58.4% of theoretical yield) of 2-bromoethylsilsesquioxane polymer. A small amount of unidentified precipitate, 0.30 g, was also isolated from the reaction mixture as noted above. Additional clear resin, in an amount of 2.1 g (17.4% of theoretical yield), was recovered from the dichloromethane-washed aqueous phase by salting out, by saturating the aqueous phase with sodium chloride. Total solids that were recovered were 78.3% of theoretical yield. The polymeric reaction product was determined (as in Example 1) to have a Mn of 1000–1400 and a Mw of 2600–3500.

EXAMPLE 3

Preparation of 1,2-Dichloroethylsilsesquioxane

α,β-dichloroethyltrichlorosilane ($ClCH_2CHClSiCl_3$) in an amount of 18.4 g (0.079 mol) was added dropwise with stirring to 250 mL distilled water at a temperature of 0° C. Dichloromethane in an amount of 200 mL was added to the aqueous reaction medium, and the reaction mixture was stirred for ten minutes, but this procedure was unsuccessful in extracting the polymeric reaction product from the aqueous phase. Only after the aqueous phase had first been saturated with sodium chloride was it possible to recover the polymeric reaction product from the reaction mixture by dichloromethane extraction. Following the initial dichloromethane extraction, the NaCl-saturated aqueous phase was then washed with three 100 Ml volumes of dichloromethane. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 3.08 g (26% of total theoretical yield) of 1,2-dichloroethylsilsesquioxane polymer. The polymeric reaction product was determined (as in Example 1) to have a Mn of 300–400 and a Mw of 550–700.

EXAMPLE 4

Preparation of 2-Chloroethylsilsesquioxane TEOS Copolymer

An organic solution containing β-chloroethyltrichlorosilane ($ClCH_2CH_2SiCl_3$) and tetraethoxysilane ($Si(OCH_2CH_3)_4$) was first prepared by adding 20.0 g (0.101 mol) of β-chloroethyltrichlorosilane and 1.05 g (0.005 mol) of tetraethoxysilane (TEOS) in 100 mL methylene chloride. This solution was added dropwise with stirring to 200 mL distilled water at a temperature of 0° C. Dichloromethane in an amount of 250 mL was next added to the reaction medium to extract the polymeric reaction product from the aqueous reaction medium, and the reaction mixture was stirred for ten minutes. The reaction mixture was then filtered, and the organic phase containing dichloromethane and extracted reaction product was separated from the aqueous phase and retained. The aqueous phase was next washed with three volumes of dichloromethane, 100 mL each, and these washings were combined with the original organic phase extract recovered from the reaction mixture. The combined organic phase solution was dried by stirring over sodium sulfate for one hour and thereafter filtered. After evaporation of the dichloromethane solvent from the organic phase solution, the polymeric reaction product that was recovered was dried overnight under high vacuum to yield a clear resin, in an amount of 9.43 g (about 75% of total theoretical yield) of 2-chloroethylsilsesquioxane TEOS copolymer resin. The polymeric reaction product was determined (as in Example 1) to have a Mn of 1580 and a Mw of 2580.

EXAMPLE 5

Preparation of 2-Chloroethylsilsesquioxane Hydridosilsesquioxane Copolymer

β-chloroethyltrichlorosilane ($ClCH_2CH_2SiCl_3$) in an amount of 22.2 g (0.110 mol) and trichlorosilane ($HSiCl_3$) in an amount of 5.08 g (0.037 mol) were combined, and the combined components were added dropwise with stirring to 250 mL distilled water at a temperature of 0° C. Dichloromethane in an amount of 250 mL was then added to the aqueous reaction medium to extract the polymeric reaction product from the aqueous medium, and the reaction mixture was stirred for ten minutes. The reaction mixture was then filtered to remove a small amount of precipitate that formed, and the organic phase containing dichloromethane and extracted reaction product was then separated from the aqueous phase and retained. The aqueous phase was extracted further with additional washings of dichloromethane, three volumes of 100 mL each. These dichloromethane washings were combined with the original organic phase extract, and the combined organic phase solution was dried by stirring over sodium sulfate for one hour and then filtered. After evaporation of the dichloromethane solvent from the organic phase extract, the polymeric reaction product that was recovered was dried overnight under high vacuum to yield a clear copolymer resin, in an amount of 6.64 g of 2-chloroethylsilsesquioxane hydridosilsesquioxane copolymer. A solid precipitate was also collected from the reaction mixture, as noted earlier, in an amount of 4.83 g to give a total recovered solids yield of 77% of theoretical yield. The polymeric reaction product was determined (as in Example 1) to have a Mn of 700–850 and a Mw of 1450–1600.

EXAMPLE 6

Preparation of Methyl 2-Chloroethylsiloxane

β-chloroethylmethyldichlorosilane (($ClCH_2CH_2$)($CH_3$)$SiCl_2$) in an amount of 25.0 g (0.141 mol) contained in 100 mL dichloromethane was added dropwise with stirring to 225 mL distilled water at a temperature of 0° C. Upon completion of the addition of the β-chloroethylmethyldichlorosilane, the aqueous reaction medium was stirred for ten minutes, and the organic phase containing dichloromethane and polymeric reaction product was then separated from the aqueous phase and retained. The aqueous phase was then extracted further with three washings of dichloromethane, in an amount of 50 mL each. The dichloromethane washings were combined with the original organic phase extract, and the combined organic phase solution was dried by stirring over sodium sulfate for one hour and thereafter filtered. After evaporation of the solvent from the organic phase extract, the polymeric reaction product that was recovered was dried overnight under high vacuum to yield a clear resin, in an amount of 15.01 g (a recovery of 86% of total theoretical yield) of methyl 2-chloroethylsiloxane polymer. The polymeric reaction product was determined (as in Example 1) to have a Mn of 650–750 and a Mw of 1250–1450. The polymeric reaction product of this Example is a substantially linear siloxane polymer that may be converted to a modified methylsilsesquioxane.

EXAMPLE 7

Preparation of Trimethylsiloxy-terminated Poly(2-chloroethyl)methylsiloxane

The polymeric reaction product from Example 6, in an amount of 10.04 g, was solubilized in 10 mL benzene and was refluxed, in the presence of 0.5 g Amberlyst® 15 ion exchange resins for about 3–4 hours at a temperature of about 80–85° C. before being cooled. The refluxing was carried out with a Dean-Stark trap connected to the condenser, and 0.24 g $H_2O$ was collected in the trap, which was removed after this reflux period.
Hexamethyldisiloxane, in an amount of 0.812 g (0.005 mol), and an additional 0.5 g Amberlyst® 15 resin were then added to the cooled solution containing the polymeric reaction product. Refluxing was again continued, for an additional three hours, before the solution was cooled and filtered. After evaporation of the organic solvent, the polymeric reaction product that was recovered was dried overnight at high vacuum to yield a clear resin, in an amount of 10.94 g of trimethylsiloxy-capped poly(2-chloroethyl)methylsiloxane polymer. The polymeric reaction product was determined (as in Example 1) to have a Mn of 1650–1700 and a Mw of 2500–2700. The polymeric reaction product of this Example is a substantially linear siloxane polymer that may be converted to a modified methylsilsesquioxane by heating.

EXAMPLE 8

Sol-Gel Preparation of 2-Chloroethylsilsesquioxane

Water, in an amount of 1.17 g (0.065 mol) was added dropwise to a solution containing 4.0 g (0.0216 mol) of β-chloroethyltrimethoxysilane ($ClCH_2CH_2Si(OCH_3)_3$) in 2.07 g (0.065 mol). Next, four drops of 0.01 M HCl were added. The reaction mixture immediately began to thicken and was allowed to evaporate over a period of four days. The polymeric reaction product, 2-chloroethylsilsesquioxane, was a dense, clear, hard resin that was slightly soluble in tetrahydrofuran solvent. The polymer reaction product was determined (as in Example 1) to have a Mn of about 4500–4700 and a Mw of about 9000–11,000. The technique described in this Example allows the formation of thicker $SiO_2$-rich films with lower density which are of potential utility in low dielectric constant applications.

EXAMPLE 9

Preparation of (β-acetoxyethyl)silsesquioxane ($BAESiO_{1.5}$)

$BAESiO_{1.5}$ was prepared by hydrolysis of β-acetoxyethyltrichlorosilane ($BAESiCl_3$) as follows: A solution of $Cl_3SiCH_2CH_2OCOCH_3$ (23.5 g, 0.106 mol) in $CH_2Cl_2$ (150 mL) was added dropwise with stirring to distilled $H_2O$ (250 mL) at 0° C. The solution became cloudy. The reaction mixture was stirred for 40 minutes; then the organic phase was separated and the aqueous phase washed with dichloromethane (3×150 mL). The combined dichloromethane solution was dried over sodium sulfate for one hour, filtered and the solvent removed using a rotary evaporator. The product was dried overnight under vacuum to yield a clear pale yellow viscous liquid (11.25 g, 78.1%). FTIR (neat, cm$^{-1}$): 3458 ($v_{OH}$); 2963, 2906 ($v_{CH}$); 1740 ($v_{CO}$); 1200, 1050, 780 ($v_{SiO}$) $^1$H NMR (CDCl$_3$) 4.17 (CH$_2$O$_2$C), 2.00 (O$_2$CCH$_3$), 1.13 (SiCH$_2$), 1.13 (SiCH). $^{13}$C NMR (CDCl$_3$), 164.5 (O$_2$CCH$_3$), 53.8 (CH$_2$O$_2$C), 14.0 (O$_2$CCH$_3$), 6.9 (SiCH$_2$). TGA/MS analysis showed the onset weight loss at 250° C. with concurrent loss of ethylene and acetic acid. Ceramic yields of 51.0% (400° C.) and 46.5% (600° C.) were observed.

Further Condensation of BAESiO$_{1.5}$: A sample of the liquid BAESiO$_{1.5}$ resin prepared above was heated to 100° C. for 72 hours to yield an off-white solid. FTIR (DRIFT, KBr, cm$^{-1}$) 3455 ($v_{OH}$) 2963, 2955 ($v_{CH}$) 1738 ($v_{CO}$) 1242, 1027 ($v_{SiO}$).

EXAMPLE 10

Preparation of (β-hydroxyethyl/silsesquioxane (BHESiO$_{1.5}$)

A solution of BAESiO$_{1.5}$ (1.96 g) from Example 9 in 5 mL propanol was treated with 1 drop sulfuric acid and heated at reflux for 12 hours. Formation of propyl acetate was confirmed by GC and FTIR analyses. Sufficient aqueous sodium bicarbonate was added to achieve pH=7. The white solid was filtered, washed with H$_2$O (3×1 mL), and dried in vacuo (0.77 g, 56.0% yield). FTIR (DRIFT, KBR, cm$^{-1}$) 3295 ($v_{OH}$); 3000, 2890 ($v_{CH}$); 1150, 1036 ($v_{SiO}$). TGA/MS analysis revealed the onset of weight loss at 250° C., concurrent with evolution of ethylene. Acetic acid was not detected by mass spectrometry at any point. Ceramic yields of 71.0% (400° C.) and 65.0% (600° C.) were observed.

COMPARATIVE EXAMPLE

Preparation of Chloromethylsilsesquioxane

A silane lacking a β-substituted alkyl group was employed in this comparative Example, which was otherwise analogous to the procedure described for Example 1. Chloromethyltrichlorosilane (ClCH$_2$SiCl$_3$) in an amount of 10.0 g (0.054 mol) was added dropwise with stirring to 100 mL distilled water at a temperature of 0° C. Dichloromethane in an amount of 100 mL was added to the aqueous reaction medium to extract the reaction product that formed in the aqueous medium, and the reaction mixture was stirred for ten minutes. The reaction mixture was then filtered, and the organic phase containing dichloromethane and reaction product was separated from the aqueous phase and retained. The aqueous phase was then extracted with additional volumes of dichloromethane, three volumes of 50 mL each, and these washings were combined with the original organic phase extract recovered from the reaction mixture. The combined organic phase solution was dried by stirring over sodium sulfate for one hour and then filtered. After evaporation of the dichloromethane solvent from the organic phase extract, the reaction product that was recovered was dried overnight under high vacuum to yield 1.37 g (25% of total theoretical yield) of chloromethylsilsesquioxane, as a fine white powder. The recovered reaction product, after drying, was found to be no longer soluble in dichloromethane, and this was attributable to the significant increase in molecular weight of the reaction product that occurred from condensation of silanol groups during drying.

Thermal treatment of the chloromethylsilsesquioxane reaction product does not result in crosslinking and elimination of a labile olefin. Conversion of chloromethylsilsesquioxane to a SiO$_2$-containing coating requires high temperatures, in excess of 450° C. which is not acceptable for many microelectronic processing applications.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A photo and thermally labile siloxane polymer which undergoes transformation to SiO$_2$-rich films by the elimination of β-substituted alkyl groups, obtained from the hydrolysis and condensation polymerization of an organosilane containing a β-substituted alkyl group, the organosilane having the general formula:

$$R_nSiX_{(4-n)}$$

where n is 1 or 2;

X is a halogen selected from the group consisting of chlorine, bromine, fluorine, and iodine; or an alkoxy selected from the group consisting of methoxy, ethoxy and propoxy substituents; and R is an alkyl group having at least one but not more than two β-substituents that are electronegative and at least one but not more than two α-substituents on the β-substituted alkyl group, the α-substituent being selected from the group consisting of chlorine, bromine, fluorine, iodine, hydroxy, methoxy, ethoxy, and acetoxy;

and wherein said siloxane contains silanol groups.

2. The siloxane polymer of claim 1 wherein the α-substituent is the same as the β-substituent on the alkyl group.

3. A photo and thermally labile siloxane polymer which undergoes transformation to SiO$_2$-rich films by the elimination of β-substituted alkyl groups, obtained from the hydrolysis and condensation polymerization of an organosilane containing a β-substituted alkyl group, the organosilane having the general formula:

$$R_nSiX_{(4-n)}$$

where n is 1;

X is a halogen selected from the group consisting of chlorine and bromine, or an alkoxy selected from the group consisting of methoxy and ethoxy substituents; and R is an ethyl group having at least one but not more than two β-substituents selected from the group consisting of bromine, fluorine, methoxy, and acetoxy and at least one but not more than two α-substituents on the β-substituted ethyl group, the α-substituent being selected from the group consisting of chlorine, bromine, fluorine, hydroxy, methoxy, and acetoxy;

and wherein said siloxane polymer contains silanol groups.

4. The siloxane polymer of claim 3 wherein the α-substituent is the same as the β-substituent on the ethyl group.

5. A photo and thermally labile siloxane polymer which undergoes transformation to $SiO_2$-rich films by the elimination of β-substituted alkyl groups, obtained from the hydrolysis and condensation polymerization of an organosilane containing an alkyl group substituted in the position β to silicon, the organosilane having the general formula:

$$(RCH_2)_n SiX_{(4-n)}$$

where n is 1 or 2;

X is a halogen selected from the group consisting of chlorine, bromine, fluorine, and iodine; or an alkoxy selected from the group consisting of methoxy, ethoxy and propoxy substituents; and R is an alkyl group having at least one but not more than two substituents in the position β to silicon that are electronegative;

and wherein said siloxane polymer contains about 20 to about 50 silanol groups per 100 silicon atoms.

6. The siloxane polymer of claim 5 wherein the siloxane polymer is obtained from homopolymerization of the organosilane.

7. The siloxane polymer of claim 5 wherein the siloxane polymer is obtained from copolymerization of the organosilane with an alkoxysilane.

8. The siloxane polymer of claim 7 wherein the alkoxysilane is selected from the group consisting of tetraethoxysilane (TEOS), tetramethoxysilane (TMOS), methoxytriethoxysilane, triethoxychlorosilane, bis(trimethoxysilyl)-ethane, methyltriethoxysilane, vinyltriethoxysilane, pentafluorophenyltriethoxysilane and tridecafluorooctyl-1H,2H,2H-octyltriethoxysilane.

9. The siloxane polymer of claim 5 which further comprises a siloxane polymer obtained from copolymerization of the organosilane with a hydride-functional silane selected from the group consisting of trichlorosilane and triethoxysilane.

10. The siloxane polymer of claim 5 which further comprises a siloxane polymer obtained from copolymerization of the organosilane with an organotrichlorosilane selected from the group consisting of ethyltrichlorosilane, methyltrichlorosilane and phenyltrichlorosilane.

11. The siloxane polymer of claim 5 wherein the reaction is carried out by the addition of the organosilane to an aqueous medium.

12. The siloxane polymer of claim 11 wherein the siloxane polymer is extracted from the aqueous medium with an organic solvent.

13. A homogeneous liquid containing the siloxane polymer of claim 5 and an organic solvent for dissolving the siloxane polymer, the solvent being selected from the group consisting of aromatic hydrocarbons and their epoxy-functional derivatives, glycol ethers, alkanes and their epoxy-functional derivatives, ketones, esters, orthoesters, chlorinated hydrocarbons, chlorofluorocarbons and alcohols.

14. The homogeneous liquid according to claim 13, wherein the organic solvent is selected from the group consisting of diglyme, methoxypropanol and toluene.

15. The siloxane polymer of claim 5 wherein the siloxane polymer is obtained from the hydrolysis and condensation polymerization of a β-substituted ethyltrichlorosilane, wherein the β-substituent is non-halogenated.

16. The siloxane polymer of claim 5 wherein, in the general formula for the organosilane, R is a methyl group or ethyl group having at least one but not more than two substituents in the position β to silicon selected from the group consisting of bromine, fluorine, iodine, hydroxy, methoxy, ethoxy, and acetoxy.

17. The siloxane polymer of claim 5 wherein, in the general formula for the organosilane, n is 1;

X is a halogen selected from the group consisting of chlorine and bromine or an alkoxy selected from the group consisting of methoxy and ethoxy substituents; and R is a methyl group having at least one but not more than two substituents selected from the group consisting of bromine, fluorine, hydroxy, methoxy, and acetoxy.

18. A photo and thermally labile siloxane polymer which undergoes transformation to $SiO_2$-rich films by the elimination of β-substituted alkyl groups, obtained from the hydrolysis and condensation polymerization of an organosilane containing an alkyl group substituted in the position β to silicon, the organosilane having the general formula:

$$(RCH_2)_n SiX_{(4-n)}$$

where n is 1 or 2;

X is a halogen selected from the group consisting of chlorine, bromine, fluorine, and iodine; or an alkoxy selected from the group consisting of methoxy, ethoxy and propoxy substituents; and R is a methyl group having at least one but not more than two acetoxy substituents;

and wherein said siloxane polymer contains silanol groups.

19. A homogeneous liquid containing a photo and thermally labile siloxane polymer which undergoes transformation to $SiO_2$-rich films by the elimination of β-substituted alkyl groups, obtained from the hydrolysis and condensation polymerization of an organosilane containing an alkyl group substituted in the position β to silicon, the organosilane having the general formula:

$$(RCH_2)_n SiX_{(4-n)}$$

where n is 1 or 2;

X is a halogen selected from the group consisting of chlorine, bromine, fluorine, and iodine; or an alkoxy selected from the group consisting of methoxy, ethoxy and propoxy substituents; and R is an alkyl group having at least one but not more than two substituents in the position β to silicon that are electronegative;

and wherein said siloxane polymer contains silanol groups;

and an organic solvent for dissolving the siloxane polymer, wherein the organic solvent is diglyme and the solubility of the siloxone polymer in the organic solvent is at least 15% by weight, based on the weight of the solution.

* * * * *